US006745149B2

(12) United States Patent
Beeten

(10) Patent No.: US 6,745,149 B2
(45) Date of Patent: Jun. 1, 2004

(54) ACOUSTICAL NOISE REDUCING ENCLOSURE FOR ELECTRICAL AND ELECTRONIC DEVICES

(76) Inventor: Todd W Beeten, 6719 Duquaine Ct., Nashville, TN (US) 37205

( * ) Notice: Subject to any disclaimer, the term of this patent is extended or adjusted under 35 U.S.C. 154(b) by 344 days.

(21) Appl. No.: 09/897,269

(22) Filed: Jul. 3, 2001

(65) Prior Publication Data

US 2003/0158695 A1 Aug. 21, 2003

Related U.S. Application Data

(60) Provisional application No. 60/223,576, filed on Aug. 7, 2000.

(51) Int. Cl.[7] ................................................. H05K 7/20
(52) U.S. Cl. ....................... 702/132; 361/687; 361/690; 361/695; 312/223.1
(58) Field of Search ........................... 702/132; 361/690, 361/687, 695, 692; 219/700; 312/223.1, 223.2

(56) References Cited

U.S. PATENT DOCUMENTS

| 5,762,550 | A | | 6/1998 | Brunner | |
|---|---|---|---|---|---|
| 5,793,608 | A | | 8/1998 | Winick et al. | |
| 6,047,501 | A | * | 4/2000 | Zeitler | 49/506 |
| 6,082,441 | A | * | 7/2000 | Boehmer et al. | 165/80.3 |
| 6,104,003 | A | * | 8/2000 | Jones | 219/400 |
| 6,115,237 | A | * | 9/2000 | Zahorsky et al. | 361/679 |
| 6,151,210 | A | * | 11/2000 | Cercioglu et al. | 361/690 |
| 6,459,579 | B1 | * | 10/2002 | Farmer et al. | 361/695 |
| 6,535,382 | B2 | * | 3/2003 | Bishop et al. | 361/690 |

* cited by examiner

*Primary Examiner*—Kamini Shah
(74) *Attorney, Agent, or Firm*—Norman N. Kunitz

(57) ABSTRACT

The invention disclosed herein is a system for controlling acoustical noise generated by electrical or electronic equipment.

The invention consists of a sealed enclosure having acoustically absorbent inner walls, a transparent sealed front door, a hinged sealed rear access panel to facilitate equipment wiring and installation and a high volume/low pressure air cooling system and additional sound and vibration absorption elements. Means for monitoring and controlling internal cabinet temperature and sealed electrical ports for interfacing the equipment housed within the enclosure to the outside while substantially reducing acoustical noise generated by that equipment.

20 Claims, 7 Drawing Sheets

INVENTOR- TODD BEETEN

US 6,745,149 B2

ACOUSTICAL NOISE REDUCING ENCLOSURE FOR ELECTRICAL AND ELECTRONIC DEVICES

FIELD OF THE INVENTION

This invention relates to electronic equipment cabinets, to the control of noise generated by electromechanical equipment and to the cooling of enclosed electronic equipment.

BACKGROUND OF THE INVENTION

Electrical and electronic equipment cabinets have been built since the late 1800's. Serviceability, access to internal components and internal heat management and control have been issues in their design for almost as long, but the need to control noise generated by internal components is a relatively new development driven by the use of equipment in sound and video recording and editing which needs to be located physically near the user.

Earlier methods to control mechanical noise generated by such devices were accomplished by placing those devices in separate rooms that were acoustically isolated from the user or in separate areas of the same room treated with sound absorbing materials. A separate room generally requires extra personnel to load and operate the recorders while same room operation is a generally a substantial compromise in equipment noise control.

With the introduction of digital audio recording and editing equipment, acoustical background noise in the recording work environment has become an even more important every day consideration.

The introduction of digital audio recorders and editing systems has been accompanied by a substantial reduction in size of these devices and has made it possible to locate them physically near the operator. This development, however, brought with it an annoying awareness of the electromechanical noise generated by that new equipment.

BRIEF DESCRIPTION OF THE INVENTION

This invention includes a sealed cabinet for housing electronic equipment having acoustically isolated air intake and exhaust ports, means for generating cooled high volume/low pressure air flow through the cabinet and acoustically sealed wiring ports for interfacing and powering said electronic equipment. The invention also includes means for monitoring and manually or automatically compensating the cabinet's internal temperature and a transparent front door to allow visual observation of the electronic equipment mounted therein. Sound and vibration absorbing elements are strategically located within the cabinet to maximize noise reduction.

OBJECTS OF THE INVENTION

The primary objects of the invention are to provide means for reducing and controlling noise generated by electronic equipment housed within the invention while managing the heat generated by said equipment to guarantee safe operating temperatures for that equipment.

Secondary objects of the invention are to allow visual observation of the housed equipment front panels and visual monitoring of temperature inside the invention and to allow practical and easy service and wiring of all electronic and electromechanical devices housed within the invention.

SUMMARY OF THE INVENTION

The invention disclosed herein is a system for controlling acoustical noise and heat generated by electrical and/or electronic equipment.

The invention consists of a sealed enclosure having acoustically absorbent inner walls, a transparent sealed front door, and a hinged sealed rear access panel to facilitate equipment wiring and installation. The invention includes a high volume/low pressure air cooling system comprised of an acoustically isolated air intake port an acoustically isolated air exhaust port containing a plurality of fans and a vibration absorption/isolation system for mounting electronic equipment within the enclosure. The invention also includes sealed electrical ports for interfacing the equipment housed within the enclosure to the outside while substantially reducing acoustical noise generated by that equipment. Means for monitoring and controlling internal cabinet temperature are also a part of the invention.

DETAILED DESCRIPTION OF THE DRAWINGS

Figure 1:
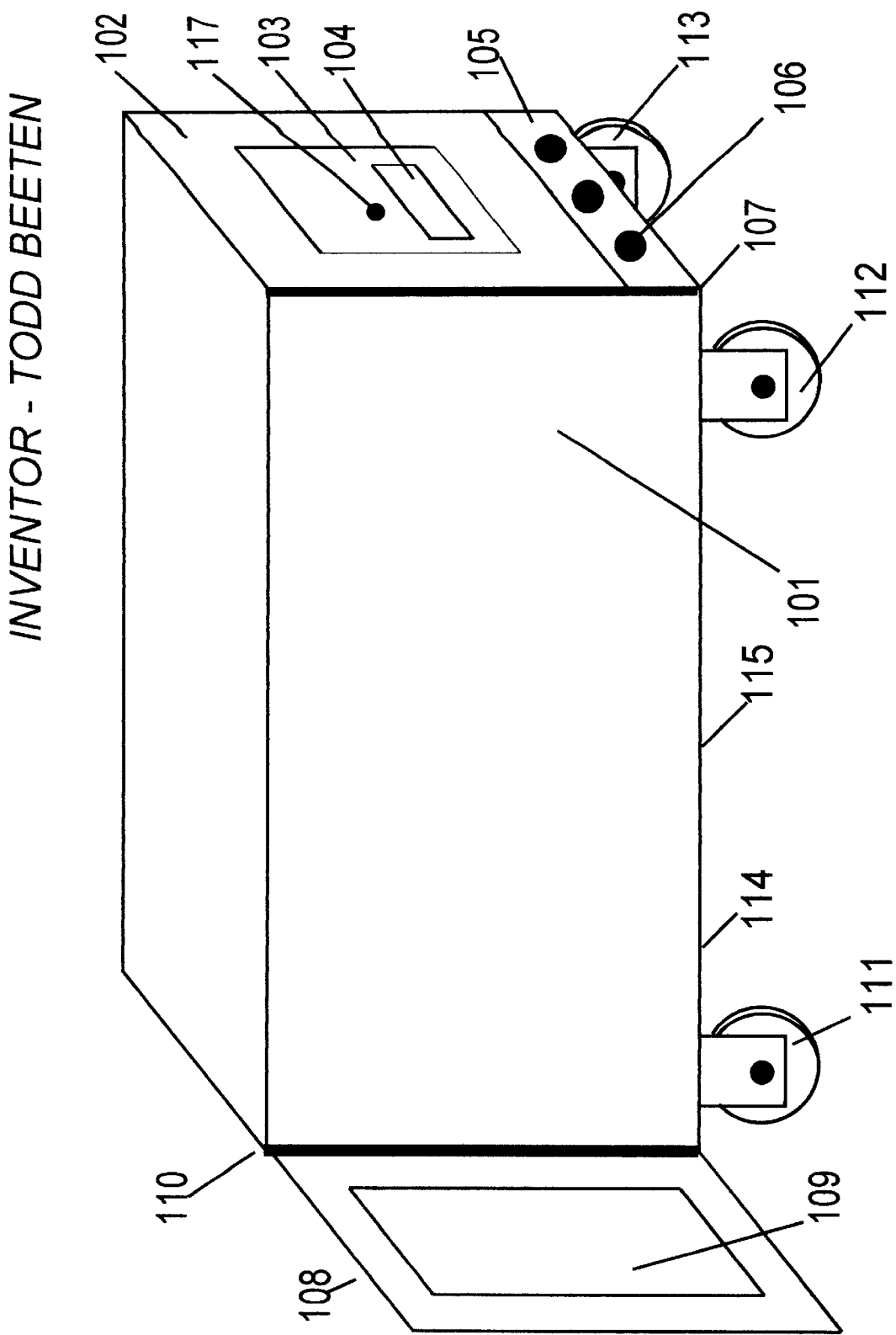
FIG. 1 is an external side view of the invention showing its general construction, layout and externally visible components.

In FIG. 1, the invention is shown as cabinet 115 having front door assembly 108, rear door assembly 102, wheels 111, 112, 113, and 114, intake filter port 101 (not visible in this figure), and wiring grommets 106 which are mounted on rear panel 105. The front door assembly 108 is attached to the cabinet by hinge 110 and includes a clear viewing window 109 which is scaled to the front door assembly by an air-tight vibration damping gasket. Door assembly 108 seals to the cabinet with a gasket not visible in this drawing. Rear door assembly 102 is attached to the cabinet by hinge 107, seals to the rear of the cabinet with an air-tight vibration damping gasket, and has an exhaust box 103 with exhaust port 104 mounted on it. 117 is an optional control knob for setting the internal box temperature.

Figure 2:
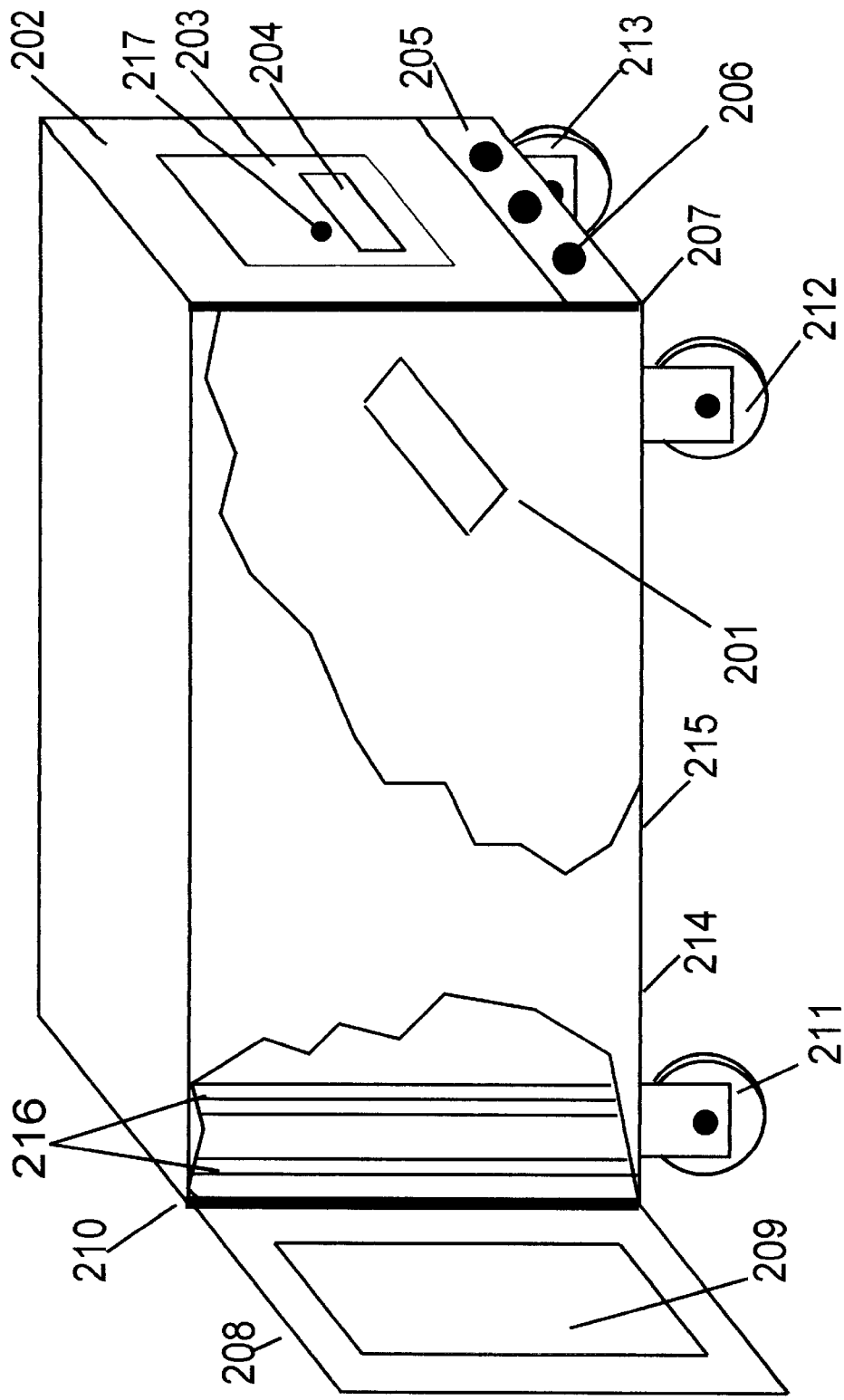
FIG. 2 is a similar drawing of the invention with a side cut-away to show the placement of the air intake port and filter in the bottom of the cabinet.

In FIG. 2, the invention is shown as cabinet 215 having front door assembly 208, equipment mounting rails 216 rear door assembly 202, wheels 211, 212, 213, and 214, intake filter port 201, and wiring grommets 206 which are mounted on rear panel 205. The front door assembly 208 is attached to the cabinet by hinge 210 and includes a vibration damped clear viewing window 209. Door assembly 208 seals to the cabinet with a gasket not visible in this drawing. Rear door assembly 202 is attached to the cabinet by hinge 207 and has an exhaust box 203 with exhaust port 204 mounted and optional internal temperature setting knob 217 on it.

Figure 3:
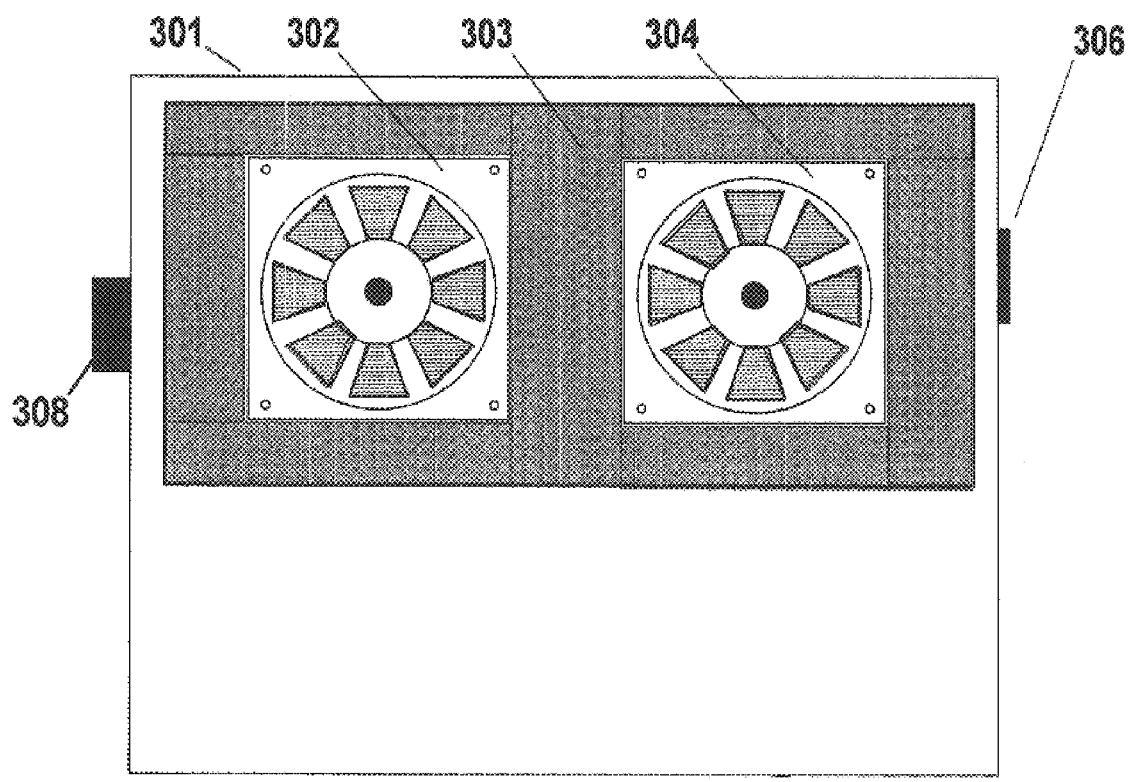
FIG. 3 is a drawing of the front of the exhaust box showing its components, layout and features.

In FIG. 3, an exterior view of the exhaust box 301 is shown with fans 302 and 304 mounted in a vibration absorbing rubber block 303. The exhaust box 301 also includes electrical connector 306, a means to supply power and to interface monitoring and control signals to electrical components in the exhaust box assembly.

Figure 4:
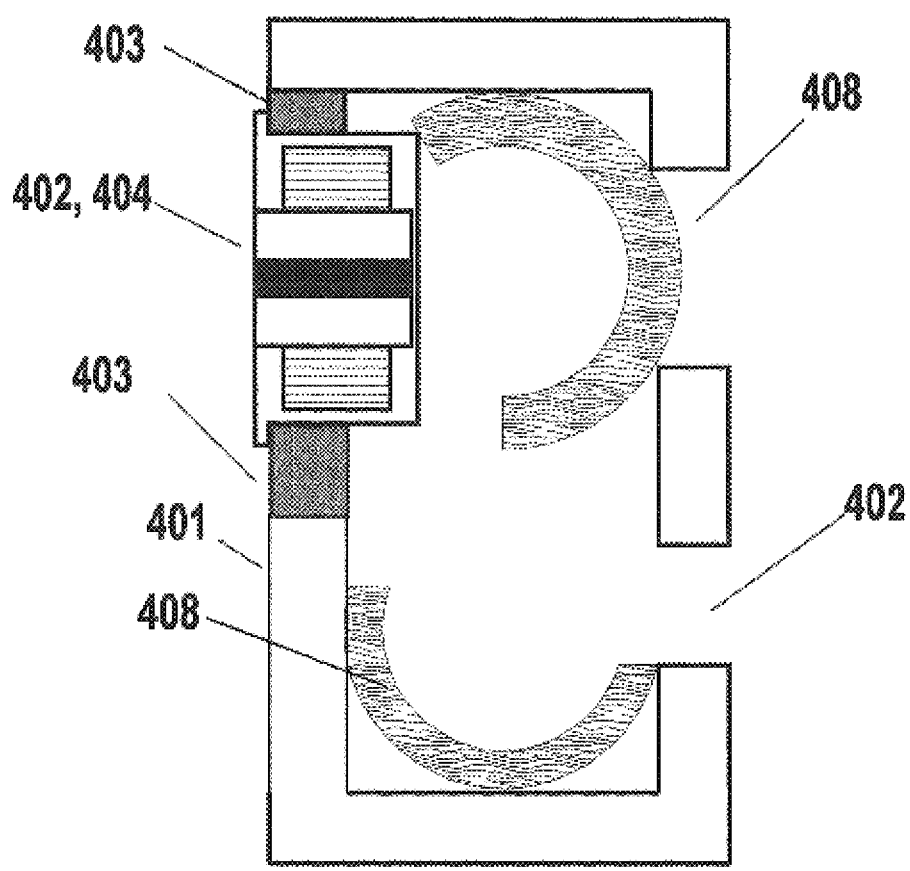
FIG. 4 is a side cut-away view drawing of the exhaust box showing it's internal construction.

In FIG. 4, a side cross section of exhaust box 401, 402 and 404 represent a cross sectional view of the blowers mounted on vibration absorbing rubber block 403. Integrated internal air guides/noise absorbers 408 and air intake port 402.

Figure 5:
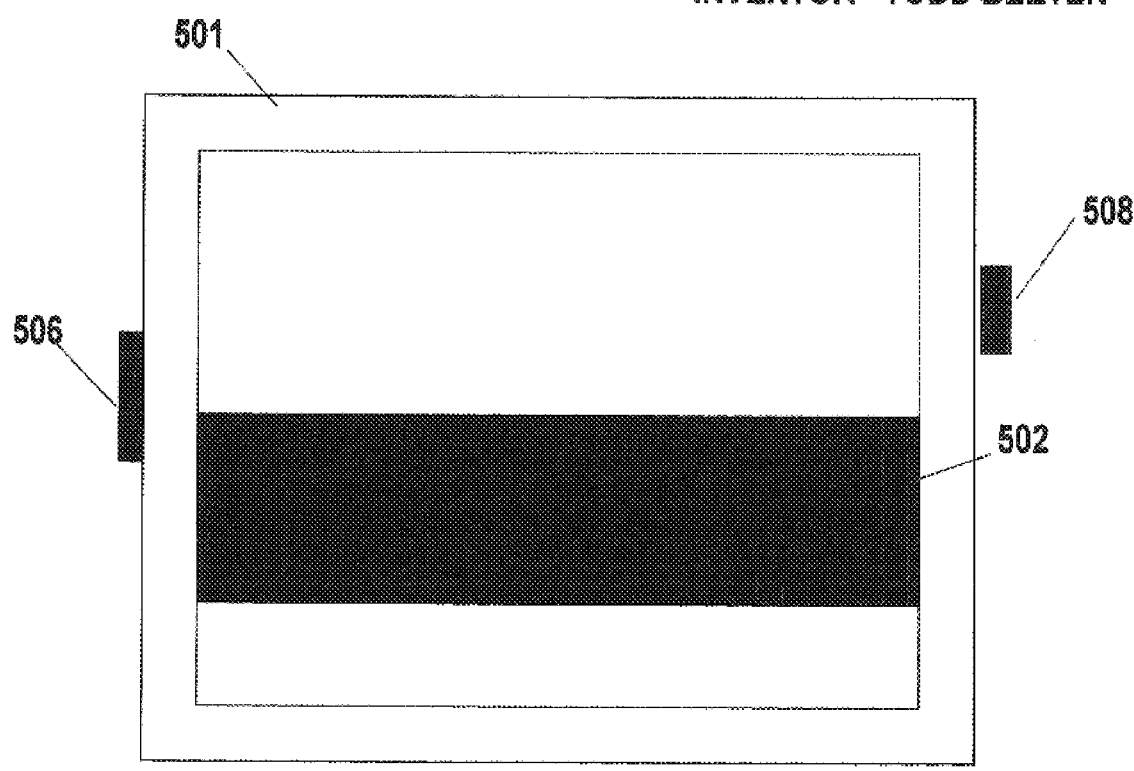
FIG. 5 is a drawing of the rear of the exhaust box showing its layout and features.

In FIG. 5, a rear view of the exhaust/plenum box 501 is shown with air exhaust port 502, 506 is the electrical interface connector and 508 is the temperature control knob.

Figure 6:
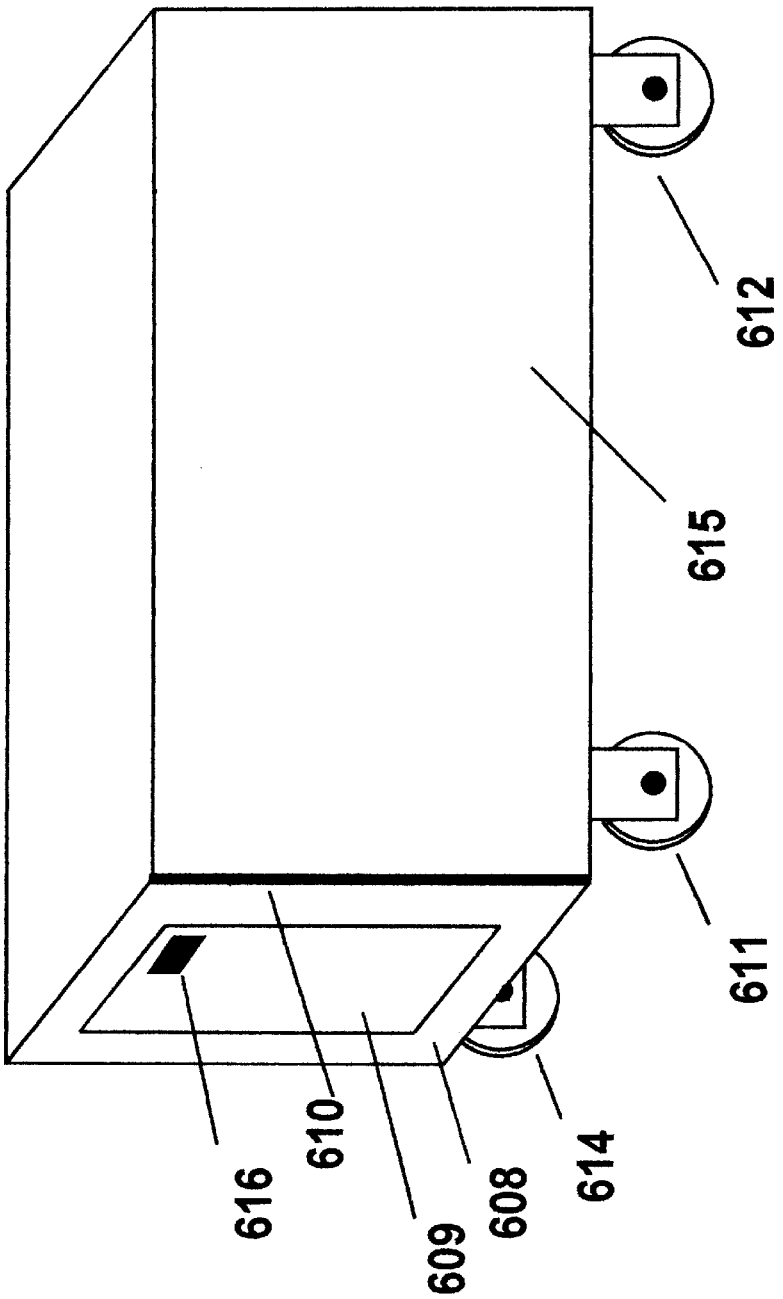
FIG. 6 is a drawing of the invention showing the front door closed and the temperature sensor/controller.

In FIG. 6, the cabinet, 615, is shown with its front door, 608, closed and with the temperature sensor/controller, 616, visible through the front door's window, 609. Three of the cabinet's four wheel assemblies, 611, 612 and 614 are also visible.

Figure 7:
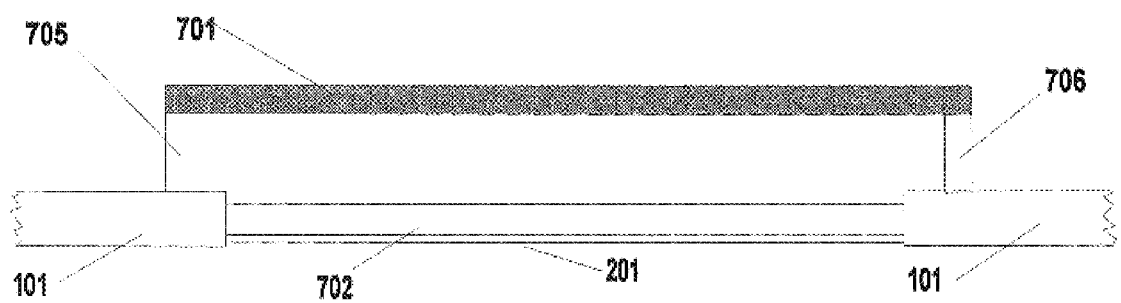
FIG. 7 is a cross section of the air intake port.

In FIG. 7, the bottom of enclosure 101 has an air intake port 201 comprised of air filtering material 702, sound absorber 701 and mounting spacers 705 and 706.

EXPLANATION OF THE INVENTION

Enclosure 115 houses electronic or electrical equipment mounted on vibration isolated rail assemblies behind its front door 108. This door, 108, seals air tight to the cabinet, 115, via a gasket mounted to the front face of the cabinet. Also behind the front door is a temperature sensor/controller. Enclosure 115 has its interior walls treated with sound absorbing material. Rear access panel 102 is mounted by hinge 107 and seals against a gasket when closed and secured.

Equipment mounting rails 216 are mounted on vibration absorbers to absorb vibrations generated by mounted equipment and to prevent them from being mechanically transmitted to the main cabinet 101.

Attached to rear access panel 102 is an internally mounted exhaust/sound trap assembly, 103, which generates a high volume of air flow at low air velocity to minimize noise generated by its operation. This is accomplished by operating the fans of blowers, 302 and 304, at rotation rates that are substantially reduced from their original design values. Blowers, 302 and 304, are mounted in a block, 303, of closed cell vibration absorbing material to eliminate noise generated by vibration of the blowers when they are operating. These rates are set by reducing original rated blower motor voltages until the desired trade off in air flow and noise generation is achieved. More precise control of cabinet airflow is accomplished by control circuit, 413, adjusted by optional control knob, 414. The exhaust air pulled into the exhaust/sound trap assembly by blowers 302 and 304 goes through a channel in the assembly created by use of the box sides and parabolically curved sound absorbing material, 410 and 411. This channel forces the air stream to change direction twice while sound entering the assembly does not change direction and thus directly contacts the sound absorbent channel material in which it is substantially reduced in level.

Front door assembly 108 has a clear window 109 which consists of a composite of a glass or plastic hard primary surface treated with sound and vibration absorbing materials. The gasket used to seal the front door 108 to the cabinet, must be made of air sealed materials such as closed cell neoprene.

Rear door assembly 102 serves as a mounting panel for the exhaust/sound trap box 103 and as an access door for installing, servicing and wiring the equipment housed therein. When closed and secured, its outer perimeter seals air tight to the box via a gasket.

Air enters the cabinet 115 through a bottom rear intake port/filter 201 which removes dust with filter 802 that would otherwise enter the cabinet and eventually accumulate and impede air flow in the equipment housed therein which would compromise the performance of the cooling system. Sound is blocked from directly from leaving the cabinet 101 through the air intake port by absorber 801 which is larger than the air intake port hole and held above the hole by spacers 805 and 806.

The wheel assemblies, 111,112,113 and 114, serve two purposes, one of which is to facilitate moving the cabinet 115 for servicing and cleaning and the second of which is to guarantee an air gap between the bottom of the cabinet and the floor so that air may be allowed to enter the intake port/filter 101. Stationary spacers guaranteeing adequate airflow may be substituted for said wheels.

To further reduce noise leaving the cabinet 115 its interior walls are lined with a sound absorbing material which reduces transmission through mechanical transfer in the cabinet walls and also by absorbing sound reflections inside the cabinet. This noise reduction process works by converting absorbed sound energy into heat energy.

Grommets 105 allow wiring entering the cabinet 115 to be sealed air tight at the entry points to prevent sound from escaping at those points. This is accomplished by filling in air gaps around wires passing through the grommets with such materials as plummer's putty for temporary wiring configurations or materials like a silicone RTV sealant for permanent wiring configurations.

Alternative Embodiments

The cabinet in this invention may be fabricated from a number of materials including but not limited to plywood, structural foam and molded plastic.

It is also possible to use are a number of alternate sound absorbing materials as substitutes in various locations in this invention including, but not limited to wool, fiberglass and foam insulation.

Preferred Embodiment

The cabinet 111 in the preferred embodiment has a height of 24.75 inches, a depth of 33 inches, and a width of 22.5 inches and is made of plywood or medium density fiberboard. It will house equipment with a maximum height of 21 inches or 12 rack units with a maximum equipment depth of 24 inches. The interior walls are lined with reticulated foam for sound absorption and the air intake port 201 has an electrostatic filter 702 fitted to it to minimize dust being sucked into the cabinet. Mounted above the air intake port 202 is a sheet of acoustic absorption material 701, such as Owens-Corning 703, which is larger than the port opening to reduce sound transmission out of that port.

Equipment is mounted in the cabinet on rails 216 located behind and to the left and right of the front door. These rails are mounted to the cabinet on vibration absorbers such as those manufactured by Sorbothane.

The exhaust/sound trap assembly 203 uses two 4.5 inch boxer fans operated at a fraction of their rated voltage to reduce air velocity. These fans are mounted in a block of one inch closed cell neoprene rubber. The exhaust/sound trap assembly box is made of 0.375 inch plywood and is 13.5 inches high, 7 inches deep and 14 inches wide. Parabolically curved, pre-shaped fiberglass sheets such as Owens-Corning 703 are used for airflow channels and sound absorbers. The rear exhaust port 204 is 13 inches wide and 4.5 inches high. A standard telephone connector 306 is used to interface wires from the boxer fans to their power supply and to interface an optional electronic fan control circuit having a control knob 217 to the temperature sensor/controller 616 mounted in the front of the cabinet.

The front door 108 is made of a hardwood frame for cosmetic and cost reasons. The front door window 109 is sealed to the frame with silicone sealant which acts both as an air sealing gasket and as a vibration absorber. The front door hinge 110 may be continuous, such a piano hinge or full overlay "European" style hinges.

The air intake port 201 is 5 inches high by 18 inches long and is fitted with a removable cleanable electrostatic air filter such as manufactured by BioKontrol.

Simple spacers guaranteeing a minimum floor to bottom gap of one inch may be substituted for wheel assemblies 111,112,113 and 114 if desired.

The rear door 102 is mounted to the cabinet 115 by hinges and may be plywood or MDF.

Grommets 206 are three inch diameter plastic units to allow passage of most common connector housings in and out of the cabinet. They are preferably sealed around wires passing through them with soft plumbers' or weather stripping putty to allow easy wiring reconfiguration.

Although described in detail, this only describes one possible configuration of the invention and a large number of possible changes in materials, components, proportions and sizes are possible and anticipated.

What I claim is:

1. A system for controlling noise and managing heat generated by electrical equipment comprise of
    a sealed enclosure,
    an air intake port containing means for reducing sound transmission,
    an air exhaust port containing means for reducing sound transmission,
    means for moving air through the enclosure from the intake port to the exhaust port without the generation of unwanted noise outside said enclosure,
    vibration absorbing means for mounting electrical or electronic equipment inside said enclosure and means for connecting external wiring into said enclosure.

2. The system described in claim 1 with the addition of means for measuring the air temperature within said enclosure and means for displaying said air temperature within said enclosure.

3. The system described in claim 1 with the addition of means for automatic control of air flow within the enclosure to regulate heat within the enclosure.

4. A system for controlling noise and managing heat generated by electrical equipment comprise of
    a sealed enclosure,
    an air intake port containing means for reducing sound transmission,
    a front door including a gasket in which said gasket serves as an air-tight sealing mechanism and as a vibration dampening device for said door and
    vibration absorbing means for mounting electrical or electronic equipment within said enclosure;
    means for connecting external wiring into said enclosure,
    a back door including a gasket in which said gasket serves as an air-tight sealing mechanism and as a vibration dampening device and
    means for moving air through the enclosure from the intake port to the exhaust port without the generation of unwanted noise outside said enclosure.

5. The invention described in claim 4 with the addition of means for automatic control of air flow within the enclosure to regulate heat within the enclosure.

6. The invention described in claim 4 with the addition of means for measuring the air temperature within said enclosure and means for displaying said air temperature within said enclosure.

7. A system for controlling noise and managing heat generated by electrical equipment comprise of
    a sealed enclosure
    an air intake port containing means for reducing sound transmission,
    an air exhaust port containing means for reducing sound transmission,
    means for connecting external wiring into said enclosure and means for moving air through the enclosure from the intake port to the exhaust port without the generation of unwanted noise outside said enclosure, in which said sealed enclosure is lined internally with sound absorbing materials, said air intake port includes means for preventing dust from being drawn into said enclosure, said air exhaust port includes an interior sound absorbing structure and materials and said means for moving air through said enclosure is mounted on a vibration damping system to minimize vibration and associated noise.

8. The invention described in claim 7 with the addition of means for measuring the air temperature within said enclosure and means for displaying said air temperature within said enclosure.

9. The invention described in claim 7 with the addition of means for automatic control of air flow within the said enclosure to regulate heat within the enclosure.

10. A system for controlling noise and managing heat generated by electrical equipment comprised of
    a sealed enclosure
    an air intake port containing means for reducing sound transmission
    an air exhaust port containing means for reducing sound transmission
    a front door with an air-tight vibration damping gasket
    a back door with an air-tight vibration damping gasket
    means for connecting external wiring into said enclosure and
    means for moving air through the enclosure from the intake port to the exhaust port without the generation of unwanted noise outside said enclosure, in which said sealed enclosure is lined internally with sound absorbing material, said air intake port includes means for preventing dust from being drawn into said enclosure, said air exhaust port includes an interior sound absorbing structure and materials and said means for moving air through said enclosure is mounted on a vibration damping system to minimize vibration and associated noise.

11. The invention described in claim 10 with the addition of means for measuring the air temperature within said enclosure and means for displaying said air temperature within said enclosure.

12. The invention described in claim 10 with the addition of means for automatic control of air flow within the enclosure to regulate heat within the said enclosure.

13. A system for controlling noise and managing heat generated by electrical equipment comprised of
    a sealed enclosure,
    an air intake port containing means for reducing sound transmission,
    an air exhaust port containing means for reducing sound transmission,
    a sealable front door,
    a sealable back door, means for connecting external wiring into said enclosure and means for moving air through the enclosure from the intake port to the exhaust port, in which said sealed enclosure is lined internally with sound absorbing materials, said air intake port includes means for preventing dust from being drawn into said enclosure, said air exhaust port is mounted on said back door and includes an interior sound absorbing structure and material and said means for moving air through said enclosure includes a vibration damping system to minimize vibration and associated noise.

14. The invention described in claim 1 wherein said means for moving air through the enclosure is mounted on said enclosure in a vibration damping manner to minimize the transmission of vibrations and noise.

15. The invention described in claim 14 wherein said means for moving includes at least one fan mounted on a wall of said enclosure.

16. The invention described in claim 5 wherein said front door is at least partially transparent.

17. The invention described in claim 16 wherein said means for measuring and said means for displaying are located within said enclosure with at least said means for displaying being visible via a transparent portion of said front door.

18. The invention described in claim 1 wherein said means for reducing sound transmission in at least one of said input port and said output port includes sound absorbing material defining a curved flow path that reverses direction at least once for flowing air.

19. The invention described in claim 18 wherein said sound absorbing material defines a flow path that reverses direction at least twice.

20. The invention described in claim 18 wherein said sound absorbing material is parabolically shaped.

* * * * *